(12) United States Patent
Gauthier, Jr. et al.

(10) Patent No.: US 6,268,286 B1
(45) Date of Patent: Jul. 31, 2001

(54) METHOD OF FABRICATING MOSFET WITH LATERAL RESISTOR WITH BALLASTING

(75) Inventors: Robert J. Gauthier, Jr., Hinesburg; Randy W. Mann, Jericho; Steven H. Voldman, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/495,499

(22) Filed: Feb. 1, 2000

(51) Int. Cl.[7] ................................................. H01L 21/44
(52) U.S. Cl. .......................... 438/655; 438/682; 438/656
(58) Field of Search .................................. 438/300, 299, 438/649, 655, 664, 585, 586; 257/377, 382, 384, 387, 346

(56) References Cited

U.S. PATENT DOCUMENTS

| | | |
|---|---|---|
| 5,270,565 | 12/1993 | Lee et al. . |
| 5,498,892 | 3/1996 | Walker et al. . |
| 5,605,854 | 2/1997 | Yoo . |
| 5,637,902 | 6/1997 | Jiang . |
| 5,656,546 | 8/1997 | Chen et al. . |
| 5,702,972 | 12/1997 | Tsai et al. . |
| 5,705,417 | 1/1998 | Tseng . |
| 5,712,200 | 1/1998 | Jiang . |
| 5,731,605 | 3/1998 | Schlangenotto et al. . |
| 5,828,107 | 10/1998 | Narita et al. . |
| 6,022,769 * | 2/2000 | Wu ....................................... 438/200 |
| 6,100,127 * | 8/2000 | Wu ....................................... 438/238 |
| 6,100,145 * | 8/2000 | Kepler et al. ........................ 438/300 |
| 6,121,092 * | 9/2000 | Liu et al. .............................. 438/281 |

* cited by examiner

Primary Examiner—David Nelms
Assistant Examiner—Dung Anh Le
(74) Attorney, Agent, or Firm—McGuireWoods, LLP; Eugene I. Shkurko (57) ABSTRACT

The current density profile in the conduction channel of a field effect transistor is controlled and thermal gradients are limited under extreme operating conditions by providing lateral resistive ballasting at the source/drain regions adjacent the conduction channel. A distributed resistance is formed by inhibiting conversion of a region of deposited salicide from a high resistance phase state to a low resistance phase state through formation of the deposit with a width or area less than a critical dimension.

10 Claims, 7 Drawing Sheets

METHOD OF FABRICATING MOSFET WITH LATERAL RESISTOR WITH BALLASTING

BACKGROUND OF THE INVENTION

1. Field of the Invention

The present invention generally relates to high density integrated circuits and, more particularly, to regulating performance and conduction characteristics of MOSFET devices included therein.

2. Description of the Prior Art

The enhancements to performance and economy of manufacture derived from high density integration of semiconductor integrated circuits have been recognized for several years. During this same period of time, field effect transistor (FET) technology has generally become the technology of choice for all but the most critical of applications in view of scalability of field effect transistors to small sizes consistent with conduction requirements and other properties facilitating process economy, integration density and high manufacturing yield as well as exhibiting good operating margins and low drive current requirements. Field effect transistors function as switching device by using a field developed by a voltage on an insulated gate to control conduction in a channel under the gate in a body of semiconductor material.

It is well-recognized, however, that the conduction properties of semiconductor materials vary strongly with temperature while exhibiting some finite electrical resistance. Generally, bulk semiconductor resistance decreases with increase of temperature. Active devices must also be isolated from each other by insulator structures which generally surround the active devices and are poor conductors of heat. Even though very thin, the gate insulator of a field effect transistor is a significant barrier to heat conduction away from the channel and junctions at or adjacent the source/drain regions.

Accordingly, increase of temperature due to resistive losses in a channel of an FET causes increase of current in the channel or a portion thereof and further increases resistive losses with attendant temperature increase. If heat is not conducted away from the conduction region in sufficient degree to stabilize the semiconductor temperature, a phenomenon known as thermal runaway may occur, rendering the transistor inoperative for switching functions and often destroying the transistor structure.

To achieve highest densities of integration, FETs are often carefully scaled in channel width in consideration of anticipated current carrying requirements. For example, a transistor used to precharge a dynamic circuit prior to an input signal evaluation may be very narrow since the current drive requirements are very low. On the other hand, clocks, I/O circuits, off-chip drivers and logic circuits with large fan-out and the like, including electrostatic discharge (ESD) circuits must provide substantial current to a load and must have wide channels in order to do so. In addition, complementary MOSFETS are often used and the channel widths proportioned relative to the conduction properties of the channel corresponding to different impurity types and concentration, usually by a small multiple (e.g. three).

In practice, the channel widths of FETs engender marked irregularities in conduction properties. While the semiconductor material of which the channel is formed is a relatively good conductor of heat, under operating conditions approaching the performance limits of FETs of any known design, the conduction channel and source/drain regions may develop substantial thermal gradients from the center to the edges thereof, transverse to the conduction path. Specifically, if a transistor is assumed to be of a constant initial temperature throughout its structure, the conduction would ideally be constant across the channel. Resistive losses should also initially be constant across the channel.

However, while heat generated from the resistive losses can be removed from the edges of the channel, heat generated near the center of the channel must be largely conducted laterally to the edges of the channel. Since heat conduction depends on the thermal gradient, heat cannot be conducted away from the center of the channel until a thermal gradient develops. The existence of a thermal gradient from the center to the edges of the channel, when developed, implies stronger conduction at the center of the channel with attendant additional resistive losses near the center of the channel. Therefore, the temperature and current near the center of the channel may become much larger than at the edges and, unless sufficient heat can be conducted through the channel to its edges and then away from the transistor to stabilize the thermal gradient and maximum temperature, thermal runaway and destruction of the transistor may result.

Accordingly, thermal dissipation properties of the transistor may be the principal limitation on transistor performance and operating conditions. Unfortunately, at high integration density and small device sizes, particularly when integrated circuit designs include isolation structures, the individual active devices have very small thermal mass while heat removal from the FET channel regions may be limited. Therefore, large thermal gradients may develop in individual FETs over a relatively few switching cycles (performed at increased clock rates enabled by increased integration density) which may vary radically between individual transistors while heat removal designs can operate only at a much larger scale and accommodating the average heat dissipation of a relatively large number of transistors.

Further, it should be recognized that integration density is generally limited by lithographic resolution at any given minimum feature size regime. Therefore, any structure of minimum feature size or larger directed to controlling thermal conditions or "ballasting" to balance voltage and current conditions within an individual transistor implies a relatively large transistor size and compromise or limitation of integration density that could otherwise be achieved. To date, no structure has been proposed which does not impose a trade-off between these conflicting goals. That is, in summary, circuit performance. functionality and manufacturing economy goals may impose limitations on performance of individual transistors which, in turn, impose limitations of the circuit performance goal which may be achieved while worst case transistor operating conditions may limit the realization of integrated circuit performance and reliability criteria which could otherwise be achieved at any given minimum lithographic feature size regime.

Additionally, it is known to form source or drain contacts to transistors by selectively depositing a layer of metal on corresponding semiconductor material regions and heat treating the substrate to alloy the metal and semiconductor and form a "salicide" (self-aligned silicide). A salicide may also be deposited directly and further alloyed with semiconductor material. It is also known that salicide preferentially develops (or is deposited) in a relatively high resistance phase state referred to as C49 that, when contacts are formed, must be converted into a low resistance phase state known as C54.

It has also been recognized (but maintained as confidential proprietary information and not published) that the C49 phase state of salicide becomes increasingly difficult to convert to the C54 phase state of salicide as the dimensions of the salicide film are reduced. While not wishing to be held to any particular theory underlying this phenomenon, it appears that nucleation site density for conversion from C49 to C54 salicide diminishes greatly at a critical dimension between 0.9 and 0.6 micrometers (or areas of about 35 and 28 square micrometers, respectively) although the difficulty of conversion can be observed over a somewhat larger range. For example, nucleation site density has been observed to diminish by one-half over a dimensional range of 3.0 to 0.6 micrometers (the former corresponding to an area of about 88 square micrometers) causing diminution of successful conversion from 76% to 19.6% over that range of dimensions.

This effect has effectively imposed a minimum contact size on the design of FETs which must carry significant current where the additional resistance could not be tolerated (but not necessarily on the design of low current devices such as pre-charge transistors alluded to above). The contact size limitation, however, has not been significant at lower integration densities than are currently being developed. Further, no exploitation of this effect to achieve meritorious or beneficial electrical characteristics or any other semiconductor device design advantage or attribute has been proposed.

SUMMARY OF THE INVENTION

It is therefore an object of the present invention to provide a transistor design which can regulate current and temperature profiles across an FET channel without requiring increased FET size.

It is another object of the invention to provide a transistor structure which will allow maximum integration density with minimal, if any, compromise of potential benefits thereof in regard to performance, functionality and/or manufacturing economy.

It is a further object of the invention to provide a technique allowing the selective development of resistances and/or connections at near minimum lithographic feature sizes.

It is a yet further object of the invention to provide a transistor which has low salicide resistance in the area of the contacts while maintaining a high salicide resistance in the vicinity of the transistor gate.

It is yet another object of the invention to provide a transistor which has two salicide resistance phase states in a common structure for optimization of manufacturability, yield, performance and electrostatic discharge robustness.

It is yet another object of the invention to provide a transistor with lateral resistor ballasting, low series resistance and a low resistance gate salicide film by maintaining a high resistance salicide film in the vicinity of the transistor gate.

In order to accomplish these and other objects of the invention, a method of fabricating a transistor is provided including the steps of forming a relatively high resistance phase state of salicide on respective portions of source/drain regions of the transistor, forming first and second salicide formations, and converting the first salicide formation to a relatively low resistance phase state of salicide while inhibiting conversion of the second salicide formation to a relatively low resistance phase state.

In accordance with another aspect of the invention, a field effect transistor is provided including a gate structure, a conduction channel, source/drain regions on opposite sides of the gate structure adjacent the conduction channel, a contact of relatively low resistance salicide located on a first portion of a source/drain region, and a region of relatively high resistance salicide located on a second portion of a source/drain region adjacent an end of the conduction channel.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
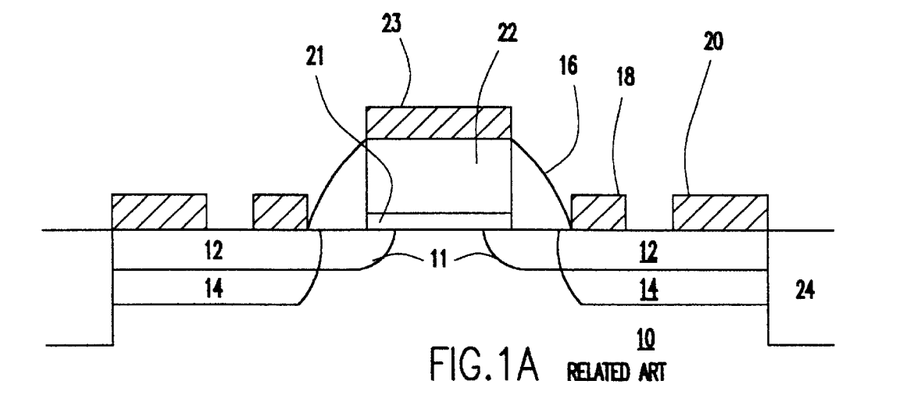
FIGS. 1A and 1B are cross-sectional and plan views of a current FET over which the invention provides an improvement.
Figure 1B:
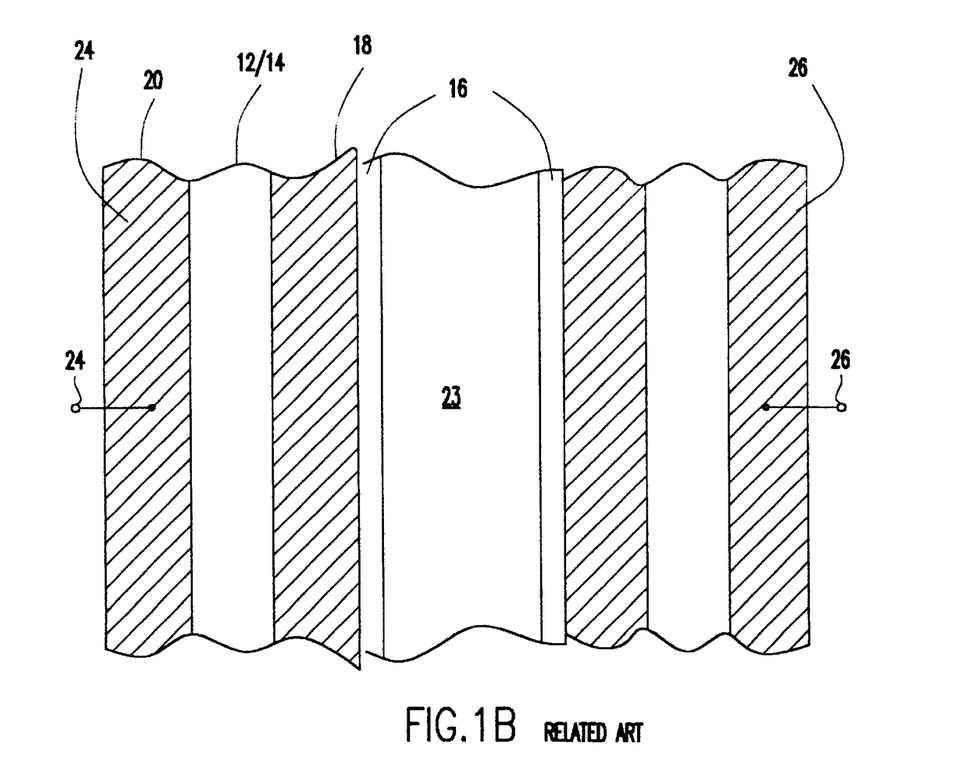

Referring now to the drawings, and more particularly to FIGS. 1A and 1B, there is shown in cross-section and plan view, respectively, a structure of a current FET design over which the present invention provides an improvement. It is to be understood that the invention may be considered to utilize some features of the design of FIGS. 1A and 1B but at a different size relative to minimum feature size as well as different materials having different electrical properties controllable in accordance with the present invention. Further, FIGS. 1A and 1B are arranged to facilitate conveyance of an understanding of the invention rather than to depict details of any particular known design. Therefore, FIGS. 1A and 1B are designated as being "Related Art" and no portion of either Figure is admitted to be Prior Art in regard to the present invention.

As shown in FIGS. 1A and 1B, a field effect transistor is formed partially within a substrate 10 by implantation of source and drain regions 12 in substrate 10, preferably self-aligned with a gate structure including a gate insulator 21 and polysilicon gate 22. In the particular structure illustrated, it is often convenient, to avoid short channel and other deleterious effects, to perform the implant in two stages 12, 14, preferably self-aligned with the gate structure 22 and sidewalls 16 formed thereon, respectively, and annealing to diffuse the implanted dopant slightly under the gate structure and sidewalls; thus developing a so-called drain extension structure, as is well-understood in the art.

Contacts to the gate, source and drain are preferably formed of a salicide (e.g. $TiSi_2$). The salicide is preferably converted to the low resistance C54 phase state. The details of deposition, formation and salicide conversion thereof are well-understood by those skilled in the art and need not be discussed further. Isolation structures are generally provided in front of and behind the plane of the page of FIG. 1A and at the ends of the source/drain regions such as are depicted by shallow trench isolation structures 24.

To provide a low resistance MOSFET gate, salicide is deposited on the polysilicon gate 22. A mask and deposition establishes salicide regions 18, 20 and 23. It should be noted however, that the salicide source/drain contacts are preferably formed as two strips 18, 20, extending across the source/drain regions. This structure is preferred to provide resistor ballasting using the resistance formed by the source/drain implant 12 and 14. The salicide strip 18 is thus connected to the salicide strip 20 through the semiconductor material 12, 14 and thence to wiring connections 24 and 26 and serves to establish a constant potential across the ends of the channel. It can thus be appreciated that this transistor structure, while including many refinements which enhance performance of the transistor, remains subject to the development of large thermal gradients across the source/drain regions and conduction channel as described above.

Figure 2A:
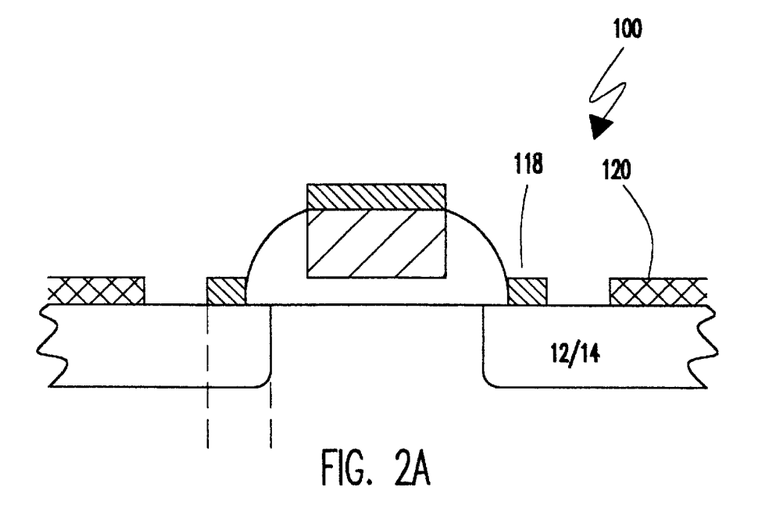
FIGS. 2A and 2B are cross-sectional and plan views, respectively, of a generalized representation of the present invention showing the development of resistive ballasting therein.
Figure 2B:
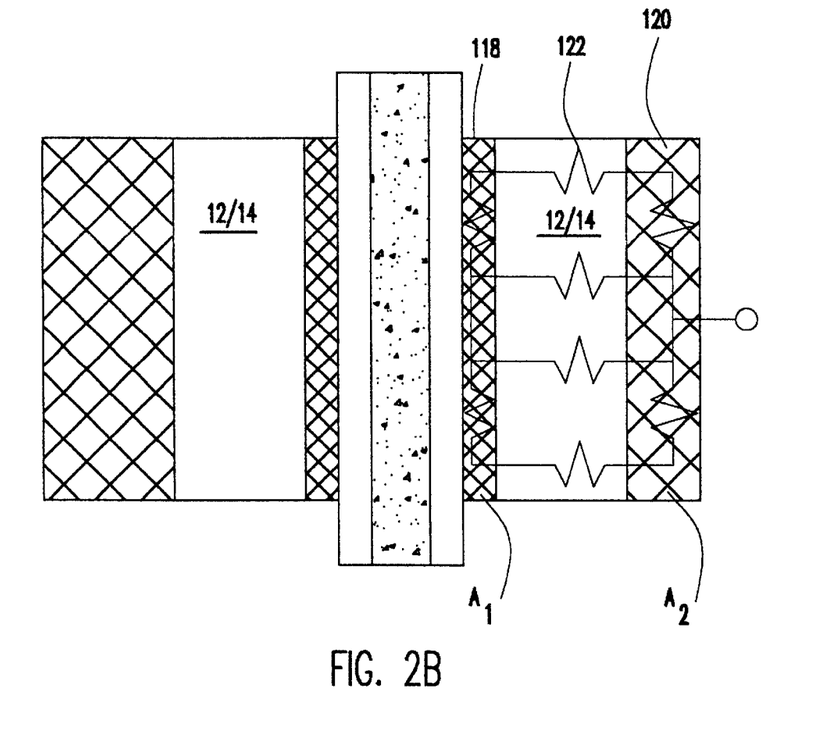

To avoid development of current constriction or thermal runaway and to regulate the current profile across the channel during high current events such as electrostatic discharge events, resistive ballasting is provided in the source/drain contacts of transistor 100 in accordance with the invention as depicted in FIGS. 2A and 2B. As with the transistor of FIGS. 1A and 1B, it is desirable to have a low resistance gate and low resistance salicide under the gate, source and drain contacts. However, to provide additional resistor ballasting which controls the current profile across the channel of the transistor, salicide film 118 is formed as a residual area and maintained in the high resistance C49 phase state by control of its dimensions. It should be recalled that both C54 and C49 salicide exhibit finite specific resistance, as does the doped semiconductor of the source/drain regions 12/14 (which are more generally depicted than in FIG. 1A since details of these structures are not at all critical to the practice of the invention and the invention may be practiced with source/drain structures of any design).

The source/drain structure and the contact thereto thus may be considered as a distributed resistance network as shown in FIG. 2B. However, in the structure of FIGS. 1A and 1B, the resistances of such a network may all be negligible, particularly if salicide 18, 20 is converted to the low resistance C54 phase state and the separation between salicide regions 18 and 20 is small in comparison with channel width, as would usually be the case with known FET designs.

However, in accordance with the principles of the invention at their most basic level, at least the resistance of salicide region(s) 118 is made non-negligible. The resistance 122 between salicide regions 118 and 120 (e.g. the specific resistance of a source/drain region) may be made non-negligible, as well, through dopant concentration, separation of salicide regions, width and/or length of a relatively high resistance salicide region or a combination thereof. By so doing, voltage drops will occur proportional to the current in and resistance of regions 118, 120 and 122 which will serve to reduce the field in the portion of the source/drain regions 12/14 adjacent the channel. Accordingly, the current profile in the channel may be regulated to avoid current constriction and temperature excursions and gradients may be constrained.

Figure 3A:
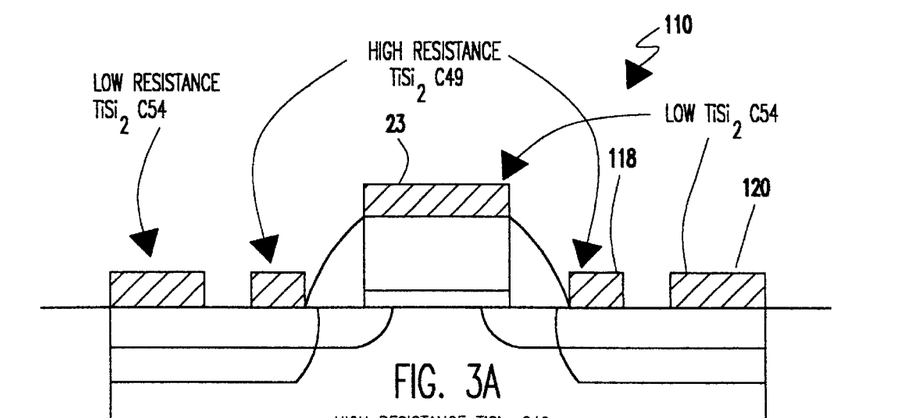
FIGS. 3A and 3B are cross-sectional and plan views, respectively, of a first embodiment of the present invention.
Figure 3B:
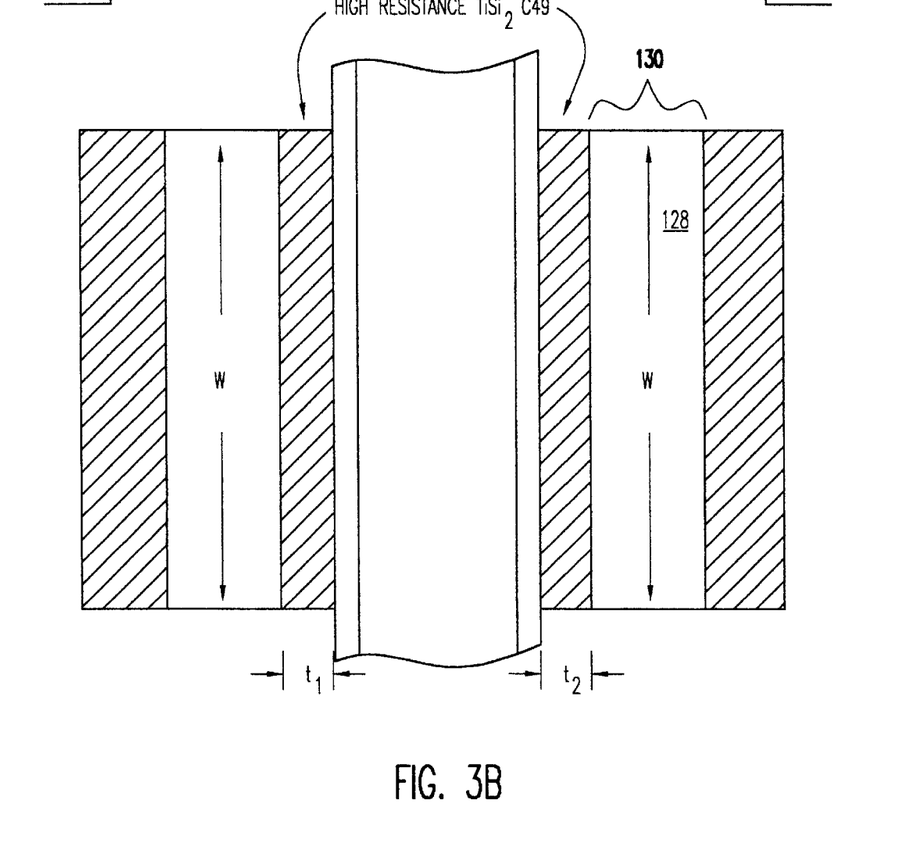

Referring now to FIGS. 3A and 3B, the principles of the invention are preferably implemented by controlling the conversion of high resistance C49 salicide to low resistance C54 salicide and, secondarily and optionally, by controlling the resistance 122 through the source/drain region by separation of the salicide regions 118, 120 and/or dopant concentration. The conversion of high resistance C49 salicide to low resistance C54 salicide is preferably achieved by controlling the width of respective salicide strips by masking of a portion of the source/drain regions and selective deposition of metal such as titanium, titanium salicide and derivatives thereof. Other refractory metals such as cobalt and tungsten are known to exhibit plural phase states having different specific resistances and are thus suitable for practice of the invention, as well. The masking of a portion of the source/drain region can simultaneously be utilized to control the separation of the salicide strips as will be discussed below.

While not wishing to be held to any particular theory of the mechanism by which C49 salicide is converted to C54 salicide, it is believed that the development of nucleation sites from which the conversion may proceed is a function of the area of deposited metal. However, for purposes of practicing the present invention, it is also valid to consider the density of C54 nucleation sites to be a non-linear function of refractory metal line width across the width of the conduction channel since the width of the conduction channel of each transistor in an integrated circuit is determined by the current each transistor must carry in the circuit. It is also believed that the non-linear variation of nucleation site density with either area or line width is indicative of the existence of some perimeter effects near the edges of the refractory metal/salicide pattern which could be explained by factors such as silicide thinning, stress, absence of grain boundary triple point nodes or the like or some combination thereof.

In any case, strongly non-linear reduction of nucleation site density for a 450 Angstrom thick titanium after treatment at 650° C. has been observed for areas smaller than about 50 square micrometers and line widths less than about 1.3 micrometers. This area and line width corresponds to a reduction of about 15% in nucleation site density and a likelihood of conversion of about 50% (generally corresponding to the likelihood that a single nucleation site will exist within the area or line width).

The likelihood of conversion to C54 diminishes rapidly as pattern dimensions are reduced below these dimensions which will be referred to hereinafter as critical dimensions. However, it should be understood that different critical dimensions may be found for other materials and other salicidation processes as will be evident to those skilled in the art and the term critical dimensions is intended to connote the ability to observe a significant non-linearity in nucleation site density and reduction of the likelihood of conversion from C49 salicide to C54 salicide corresponding to an acceptable manufacturing yield.

In the embodiment 110 of the invention illustrated in FIGS. 3A and 3B, the invention is applied to both source/drain regions of the transistor. As will be discussed in greater detail below, a mask is applied to prevent metal deposition on separation region 128 It should be understood that the width 130 of separation region 128 is not critical to the practice of the invention and could be as small as the minimum lithographic feature size.

It should be appreciated that the dimension 130 of the mask does not directly define the width of either strip 118 or 120 but, rather, the placement or registration of the mask relative to the source/drain area defines the width $t_1$, $t_2$, of the strip 118 which can thus be less than the minimum lithographic feature size. Therefore, development of $t_1$ and/ or $t_2$ of less than the critical width or area dimensions can readily be achieved and conversion from high resistance C49 salicide to low resistance salicide can be readily and selectively controlled such that strip 120 is converted to C54 salicide while strip 118 remains of the C49, high resistance phase state.

It should also be appreciated that the actual resistance developed in strip 118 is also a function of the cross-sectional area or width as well as the sheet resistance of the C49 salicide. Therefore, the voltage drop in the strip 118 can be readily controlled to adjust the current profile and Joule heating in the transistor conduction channel, as will be evident to those skilled in the art. For example, although not necessary to the practice of the invention, the width of either or both of the salicide strips 118, 120 could be varied (while keeping at least $t_1$, $t_2$ or areas $Wt_1$, $Wt_2$ below the critical dimension) in order to adjust the conduction current profile and limit the current constriction that can develop.

Figure 4A:
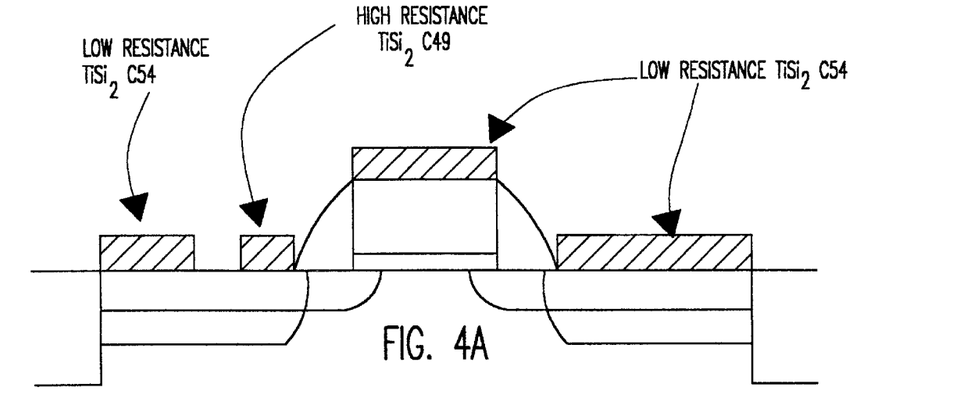
FIGS. 4A and 4B are cross-sectional and plan views, respectively, of a second embodiment of the present invention.
Figure 4B:
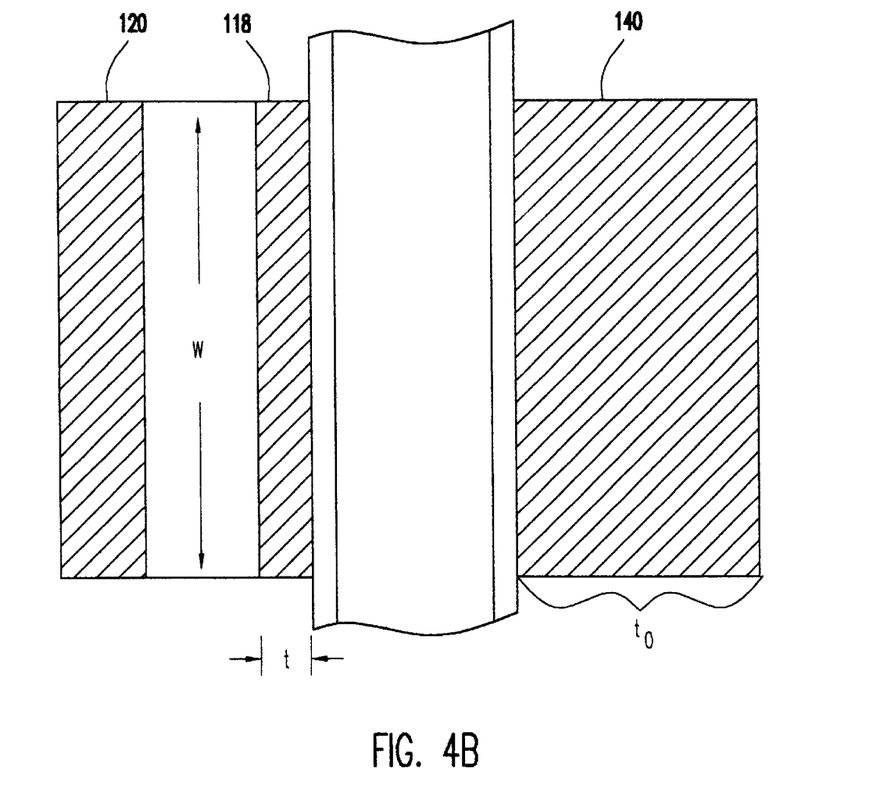

As illustrated in FIGS. 4A and 4B, the invention can be practiced effectively on only one of the source/drain regions of a transistor. That is, salicide strip electrodes 118 and 120 can be formed on one side of the gate electrode 23 while a low resistance continuous C54 electrode can be formed on the other side of gate 23. This variation of the invention can be particularly useful for reducing the overall size of the transistor since the width $t_0$ of electrode 140 need only be sufficiently larger than the critical dimension to assure conversion to low resistance C54 salicide and can thus approach the minimum lithographic feature size. By way of comparison, the source/drain regions of the embodiment of FIGS. 3A and 3B must both be of a width equal to the sum of at least the minimum feature size and the widths of salicide strips 118 and 120.

Figure 5A:
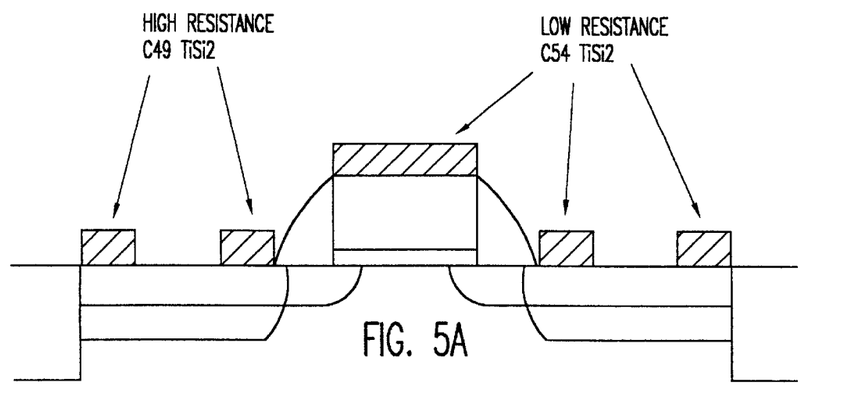
FIGS. 5A and 5B are cross-sectional and plan views, respectively, of a third embodiment of the present invention.
Figure 5B:
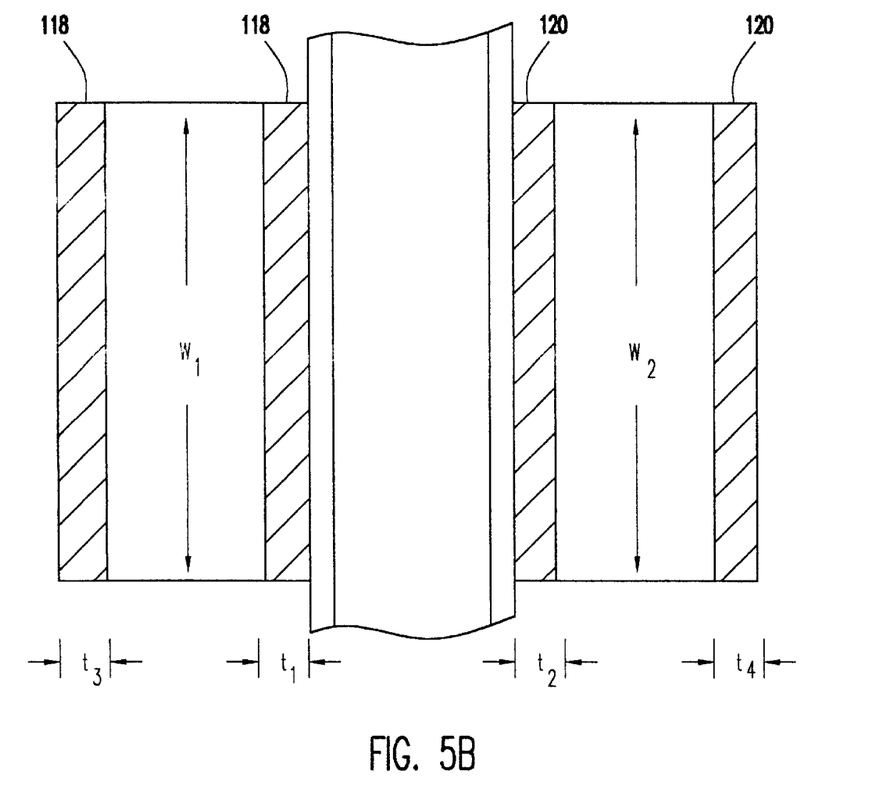

Referring now to FIGS. 5A and 5B, a further embodiment of the invention is illustrated. In this embodiment, the mask dimensions and location are adjusted to provide low resistance C54 salicide strip electrodes on one side of gate 23 and high resistance C49 electrodes 118 on the other side of gate 23. This embodiment provides the advantages of avoiding a manufacturing failure mode alluded to above by utilizing strip electrodes 120 rather than the continuous electrode 140 of FIGS. 4A and 4B while providing the capability of further adjusting the conduction current profile through provision of two high resistance C49 salicide electrodes on the same source/drain region.

Figure 6:
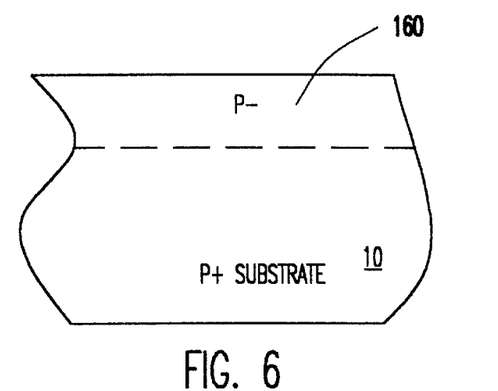
FIGS. 6, 7, 8, 9, 10 and 11 are cross-sectional views illustrating fabrication of the present invention.

A preferred technique for manufacture of transistors in accordance with the invention will now be discussed with reference to FIGS. 6–11. FIG. 6 shows a cross-section of a substrate 10 which is assumed as a starting point for the process. The substrate is illustrated to be of the p+type but those skilled in the art will recognize that the impurity type or concentration is not critical to the practice of the invention and can be achieved in numerous ways. A p–epitaxial layer is preferably deposited thereon but is similarly not critical to the practice of the invention.

Figure 7:
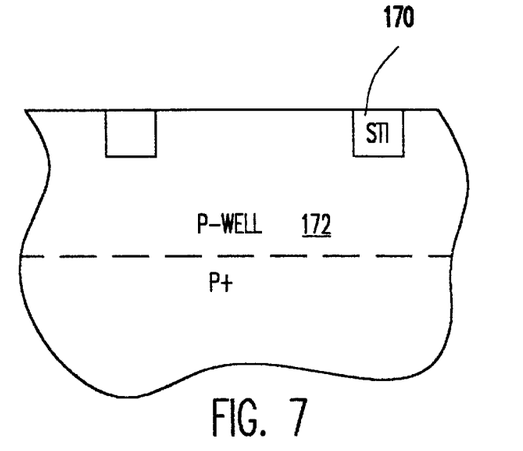

As shown in FIG. 7, isolation structures are formed by any known technique. Shallow trench isolation structures 170 are illustrated but should be understood as being exemplary of only one form of isolation structure suitable for use in accordance with the invention. Additional impurities are implanted to an increased depth in the substrate 10 to form an impurity well in which the transistor channels and source/drain regions will be formed.

Figure 8:
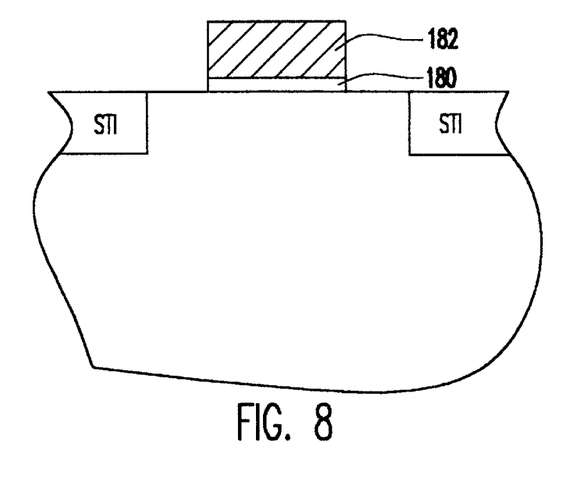
Figure 9:
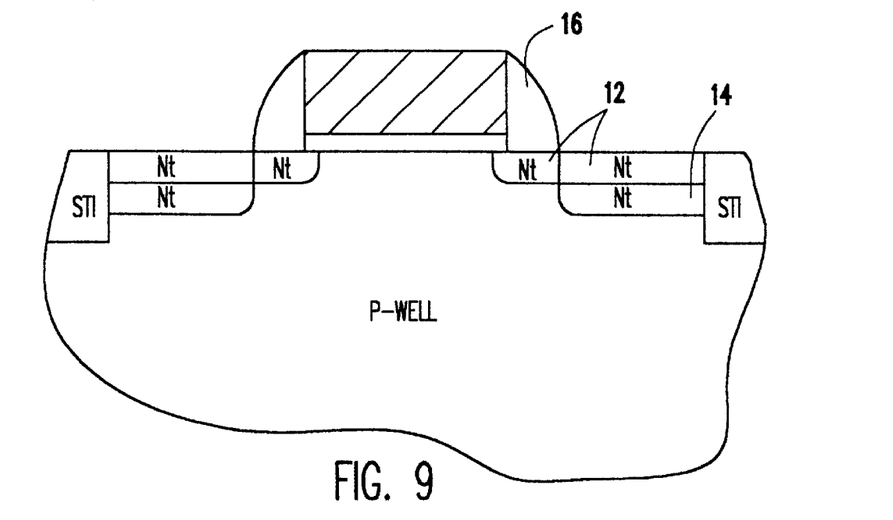
Figure 10:
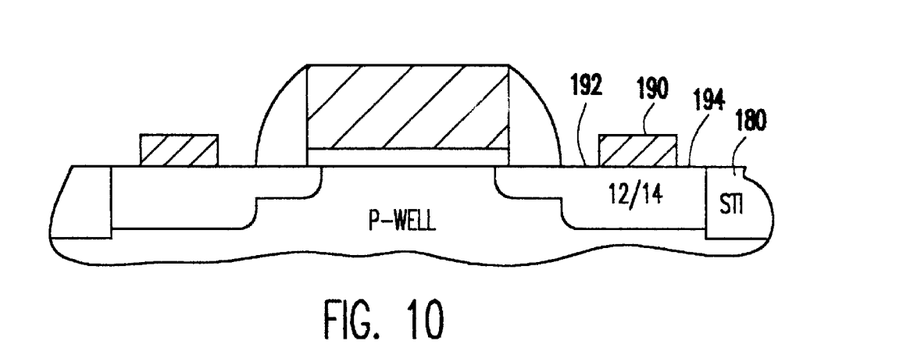

As shown in FIG. 8, the transistor locations are defined between the isolation structures 170 by the deposition or growth of a gate oxide 180, deposition of a polysilicon layer 182 thereover and patterning of both layers to form the transistor gates. The source/drain regions can then be formed, for example, in a manner self-aligned with the transistor gates as shown in FIG. 9. Specifically, as is known, a shallow impurity implant is performed self aligned with the gate 23 to form a drain extension structure such as LDD regions. Sidewall spacers 16 are formed by isotropic deposition of a thick conformal blanket layer of insulator which is then anisotropically etched to leave vertical deposits on the sides of the gate 23.

A further impurity implantation can then be performed to a greater depth and self-aligned with the sidewall spacers 16 as illustrated at 14 and annealed to complete the source/drain regions. It will be recognized by those skilled in the art that the portion of the process shown in FIGS. 6–9 is conventional and exemplary of processes which can be used to form field effect transistors of any design to which the invention may then be applied.

In accordance with the invention, a mask is applied to one or both of the source/drain regions 12/14, preferably by applying, exposing and developing a resist layer such that mask patterns 190 remain. This mask is preferably formed of nitride or other material capable of withstanding subsequent high temperature processing and patterned by a reactive ion etch (RIE) since it is preferably left in place at least through salicide formation. These patterns are recessed from gate sidewall 16 by a distance (or defining an area) 192 of less than the critical dimension discussed above on at least one side of the gate structure. An area 194 is also exposed between the mask 190 and the isolation structure which may be greater than (e.g. as in the embodiment of FIGS. 3A, 3B, 4A and 4B) or less than (e.g. as in the embodiment of FIG. 5A and 5B) as may be dictated by the transistor design, operating conditions and the current profile and temperature gradient to be achieved.

Figure 11:
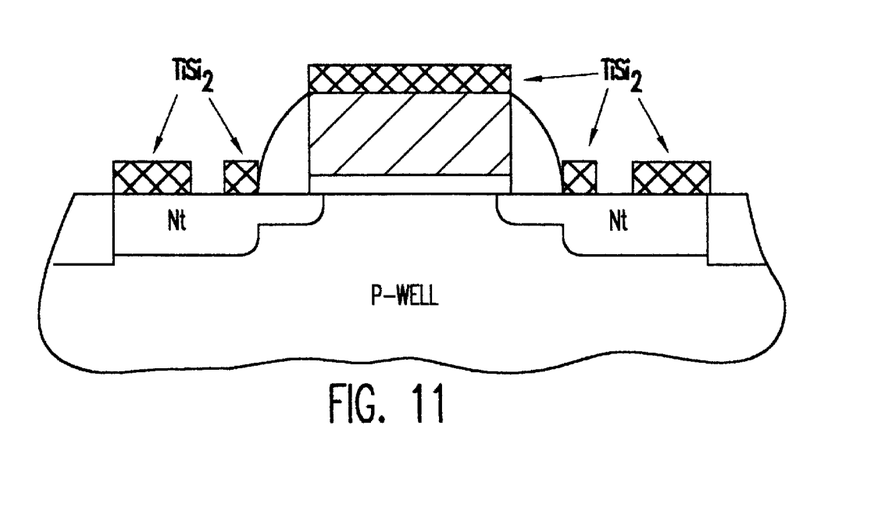

Then, as illustrated in FIG. 11, C49 titanium is then deposited and heat reatment is performed to form salicide. In this regard, it will be recognized by those skilled in the art that the deposited metal on the surface is consumed and the salicide forms below the surface of the source/drain region as shown by dashed line 192 although it has been depicted, as a matter of clarity, convenience and possible structural alternative, on the surface of the source/drain region in FIG. 11 and other Figures. Also, if heat treatment is performed in a nitrogen atmosphere, as is preferred, the salicide so formed will be covered with a metal nitride which forms simultaneously with nitride formation. The mask 190 and or the metal nitride may then be removed, patterned or left in place. The transistor is then completed by processing in a known manner to convert the high resistance C49 salicide to low resistance C54 salicide except where conversion is avoided by salicide deposit dimensions which are less than the critical dimensions.

In view of the foregoing, it is seen that the invention provides a technique and structure for resistive ballasting of individual transistors which allows adjustment of the conduction channel current density profile and limits the development of thermal gradients across the transistor conduction channel. The invention thus provides improved consistency of conduction properties under severe operating conditions approaching design limits. Further, the invention avoids limitation of integrated circuit performance by thermal considerations and permits maximum integration density to be realized.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of fabricating a transistor including the steps of
    forming a relatively high resistance phase state of salicide on respective portions of source/drain regions of said transistor, forming first and second salicide formations, and
    converting said first salicide formation to a relatively low resistance phase state of salicide while inhibiting conversion of said second salicide formation to a relatively low resistance phase state.

2. A method as recited in claim 1, comprising the further step of
    defining a separation of said first salicide formation and said second salicide formation with a mask.

3. A method as recited in claim 2, wherein said mask exposes a portion of a source/drain region adjacent a gate of said transistor.

4. A method as recited in claim 2, wherein a width of said mask corresponds to a minimum lithographic feature size.

5. A method as recited in claim 3, including the further step of
    determining a specific resistance of said source/drain region by concentration of implanted impurities in said source/drain region.

6. A method as recited in claim 5, including the further step of
    determining resistance of said source/drain region by at least separation of said first and second salicide formations.

7. A method as recited in claim 3, wherein said portion of a source/drain region adjacent said gate is of a width less than 0.9 micrometers.

8. A method as recited in claim 3, wherein said portion of a source/drain region adjacent said gate is of a width less than 0.6 micrometers.

9. A method as recited in claim 3, wherein said portion of a source/drain region adjacent said gate is of a area less than 35 square micrometers.

10. A method as recited in claim 3, wherein said portion of a source/drain region adjacent said gate is of a area less than 28 square micrometers.

* * * * *